United States Patent [19]
Shimizu et al.

[11] Patent Number: 5,126,188
[45] Date of Patent: Jun. 30, 1992

[54] SHAPED MATERIAL FOR USE IN SEALING ELECTRONIC PARTS

[75] Inventors: Toshiki Shimizu; Seiichi Fukunaga; Minoru Matsumura, all of Ibaraki, Japan

[73] Assignee: Toyo Tire & Rubber Company Limited, Osaka, Japan

[21] Appl. No.: 539,816

[22] Filed: Jun. 18, 1990

[30] Foreign Application Priority Data

Jun. 16, 1989 [JP] Japan .................. 1-71140[U]
Jan. 10, 1990 [JP] Japan .................. 2-4316
May 24, 1990 [JP] Japan .................. 2-135104

[51] Int. Cl.$^5$ .................. B32B 27/38; B05D 1/36
[52] U.S. Cl. .................. 428/215; 428/414; 428/415; 428/412; 428/419; 428/473.5; 428/474.4; 428/525; 427/410
[58] Field of Search .............. 428/215, 332, 413, 414, 428/415

[56] References Cited
U.S. PATENT DOCUMENTS 4,761,335  8/1988  Aurichio et al. .................. 428/414

Primary Examiner—P. C. Sluby
Attorney, Agent, or Firm—Armstrong & Kubovcik

[57] ABSTRACT

The present invention provides a film-coated shaped material for use in sealing an electronic part having high shape retentivity and prepared by blanking a film-coated epoxy resin sheet in a shape in conformity with the configuration of the electronic part, the epoxy resin sheet comprising a plastics film having a thickness of 10 to 1000μ and a layer of a curable epoxy resin composition in a substantially uncured state and formed on one surface of the film, the epoxy resin composition comprising per 100 parts by weight of an epoxy resin, 5 to 50 parts by weight of a thermoplastic resin having a number average molecular weight of at least 5000, 5 to 300 parts by weight of an inorganic filler and a curing agent, and a chip sealing material flow preventing frame comprising the above film-coated epoxy resin.

The present invention further provides a shaped material for use in sealing an electronic part, having high shape retentivity and comprising the film-coated epoxy resin sheet, the shaped material being thermally curable by two divided steps, i.e., a first step of gelling the shaped material at a temperature at which the material melts and adheres to an adherend without flowing out, and a second step of curing the epoxy resin composition at a higher temperature than in the first step without allowing the composition to flow out, and a chip sealing material flow preventing frame comprising the shaped material.

5 Claims, 2 Drawing Sheets

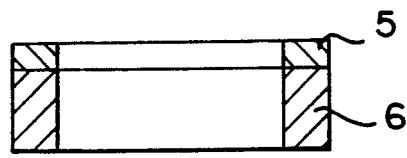
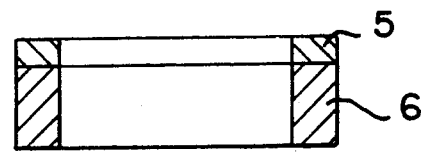
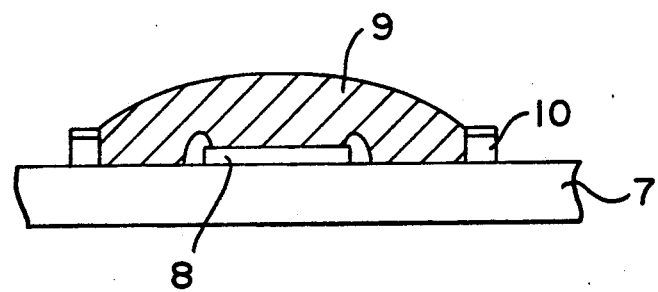

SHAPED MATERIAL FOR USE IN SEALING ELECTRONIC PARTS

The present invention relates to sealing materials for electronic parts (switches, relays, potentiometers, transformers, capacitors, sensors, etc.).

The invention relates also to a frame for preventing the flow of a COB sealing material (hereinafter referred to as "chip sealing material") for use in fabricating products of reduced thickness in the electronics industry, for example, in mounting ICs directly on a substrate and sealing the resulting chips with the material so as to prevent the flow of the sealing material.

The invention further relates to a shaped material, such as a flow preventing frame for a chip sealing material, corrosion inhibiting means or the like, for use in sealing electric or electronic parts so that an adhesive can be applied only to the required portion of such parts while being prevented from flowing out over other unnecessary portions.

Conventionally, electric or electronic parts (hereinafter referred to merely as "electronic parts") are sealed, for example, by:

(1) applying an epoxy resin in the form of a liquid to the upper surface of the case of the electronic part with a dispenser and thermally curing the resin, or (2) placing a solid shaped epoxy resin material, which is solid at room temperature and substantially uncured, on the case of the part and melting the material once with heating to cure the material.

With the method (1), however, the resin is difficult to handle and is likely to clog up the dispenser nozzle or undergo variations in viscosity, failing to produce seals of definite quality.

The solid shaped epoxy resin material used in the method (2) is merely placed on the case of the part and is therefore easier to handle than the resin of the method (1) and free of problems such as clogging of the nozzle and viscosity variations. Nevertheless, the epoxy resin material is less flowable when melted than the liquid epoxy resin, so that the lead pin portion or the corner of the case, for example, can not always be completely sealed. Further the epoxy resin, when once melted by heating, coagulates and therefore ascends or creeps upward along the lead pin markedly to result in faulty sealing.

On the other hand, methods are known of preventing the chip sealing material from excessively flowing and spreading to undesired portions. These include.

(1) a method of forming a frame of highly viscous liquid epoxy resin by a dispenser or the like to form a framelike bank on curing, (2) a method of applying an adhesive to one side of a frame of shaped material and affixing the frame to the desired part, and (3) a method of placing on the part a frame of epoxy resin which is solid at room temperature and in a substantially uncured state, and melting the frame by heating to form a bank.

However, the method (1) is low in accuracy when practiced manually. Although the frame can be formed as positioned accurately when the method is practiced mechanically, troubles are then encountered such as clogging of the nozzle or variations in the quantity of resin applied due to variations in viscosity. The method (2) requires an increased number of steps for applying the adhesive (difficult to practice automatically). The method (3) has the drawback of failing to form banks in a definite configuration by molten frames.

An object of the present invention is to provide a shaped material for use in sealing electronic parts properly with high shape retentivity because the material exhibits satisfactory flowability in a molten state and is diminished in the likelihood of creeping up along terminals or the like of electronic parts.

Another object of the invention is to provide a shaped material for use in sealing electronic parts which is easy to handle and definite in quality and which has an excellent appearance permitting adhesion of a film thereto, a smooth surface and high shape retentivity.

Another object of the invention is to provide a shaped material for preventing the flow of a chip sealing material which is easy to handle such as a frame and properly positionable to form a blank in the contemplated configuration with good stability.

Another object of the invention is to provide a highly shape-retentive shaped material for use in sealing electronic parts which is, for example, in the form of a sealing material flow preventing frame having high ability to retain the width of the frame line and good adhesion to the substrate and which is easy to handle since the material needs only to be placed on the substrate.

Another object of the invention is to provide a highly shape-retentive shaped material for use in sealing electronic parts which is adapted to seal off only the desired portion of a coil for corrosion inhibition without permitting an adhesive to flow to unnecessary portions.

These and other objects of the present invention will become apparent from the following description.

The present invention provides a film-coated shaped material for use in sealing an electronic part having high shape retentivity and prepared by blanking a film-coated epoxy resin sheet in a shape in conformity with the configuration of the electronic part, the epoxy resin sheet comprising a plastics film having a thickness of 10 to 1000$\mu$ and a layer of a curable epoxy resin composition in a substantially uncured state and formed on one surface of the film, the epoxy resin composition comprising per 100 parts by weight of an epoxy resin, 5 to 50 parts by weight of a thermoplastic resin having a number average molecular weight of at least 5000, 5 to 300 parts by weight of an inorganic filler and a curing agent.

The invention further provides a chip sealing material flow preventing frame comprising the film-coated epoxy resin sheet.

For use in sealing an electronic part, the invention further provides a shaped material having high shape retentivity and comprising the film-coated epoxy resin sheet, the shaped material being characterized in that it is thermally curable by two divided steps, i.e., the first step of gelling the shaped material at a temperature at which the material melts and adheres to an adherend without flowing out, and the second step of curing the epoxy resin composition at a higher temperature than in the first step without allowing the composition to flow out.

The present invention also provides a chip sealing material flow preventing frame comprising the shaped material cured by the above two divided steps.

The epoxy resin in the present invention includes, for example, bisphenol A type epoxy resin [Epikote 828, 825, 827, 834, 1001, 1002, 1003, 1004, 1007, 1010, 1100L, etc., products of Yuka Shell Epoxy Co., Ltd.], brominated bisphenol A type epoxy resin [Epikote 5050, 5051, 5051S, etc., products of Yuka Shell Epoxy Co., Ltd.], novolak type epoxy resin [DEN 431, 438, etc., products of Dow Chemical Co., Ltd,], o-cresol novolak type epoxy resin [ESCN-220L, ESCN-220F, ESCN-220H, ESCN-220HH, etc., products of Sumitomo Chemical Co., Ltd.], brominated novolak type epoxy resin [BREN-S, EOCN 1020, etc., products of Nippon Kayaku Co., Ltd.], phenol novolak type epoxy resin [ESPN-180, etc., products of Sumitomo Chemical Co., Ltd.], alicylic epoxy resin [Araldite CY-175, product of Ciba Chemical Co., Ltd.], and modified epoxy resins thereof. They may be used in combination with one another. An epoxy resin which is liquid at room temperature or B-stage epoxy resin may be used in this invention if an epoxy resin mixture containing it is solid at room temperature (25° C.). An epoxy resin mixture has a melting point of preferably 50° to 120° C.

Examples of the thermoplastic resins having a number-average molecular weight (hereinafter referred to simply as "molecular weight") of at least 5000 include polyamide resins, polycarbonate resins, polyurethane resins, polyester resins, polysulfone resins, silicone resins, phenoxy resins, vinyl chloride resins, polystyrene resins, ABS resins, polyvinyl alcohol resins, ionomer resins, methacrylate resins, polyphenylene oxide resins, and chlorinated polyethylene resin. They also include rubbers such as elastomer, natural rubber, isoprene rubber, butadiene rubber, styrene butadiene rubber, nitrile rubber, chloroprene rubber, silicone rubber, and norbornane polymer.

The thermoplastic resin used in this invention is intended to improve the mechanical properties of the uncured sheet. With a molecular weight lower than 5000. the thermoplastic resin does not produce a sufficient improving effect and the resulting sheet is very brittle. Conversely, with a molecular weight higher than 100,000, the thermoplastic resin has high melt viscosity, making it necessary to perform mixing at a high temperature with a large amount of energy. In addition, the sheet containing such a thermoplastic resin does not melt easily upon heating. Therefore, the molecular weight of the thermoplastic resin should preferably be up to 100,000. With an amount less than 5 parts by weight, the thermoplastic resin produces only a little effect of improving the mechanical strength (especially, the mechanical strength to withstand the blanking step) of the uncured sheet. With an amount in excess of 50 parts by weight, the thermoplastic resin impairs the characteristic properties such as heat resistance and solvent resistance of the epoxy resin.

Examples of inorganic fillers for use in the present invention are mica, silica, aluminum hydroxide, glass fiber, glass flakes, glass poweder, carbon fiber, talc, calcium carbonate, $Li_2O.Al_2O_3.SiO_2$ and the like. The inorganic filler is used in an amount of 5 to 300 parts (by weight, the same as hereinafter), preferably 30 to 100 parts, per 100 parts of the epoxy resin. If the amount is less than 5 parts, a substantially reduced coefficient of expansion will not be obtained and it is likely that the film will warp owing to the difference between the film and the resin layer in coefficient of expansion. Whereas amounts exceeding 300 parts result in a great apparent viscosity, permitting the composition to undergo a curing reaction due to the heat evolved during mixing and making it impossible to obtain the composition in a substantially uncured state. Furthermore, the adhesion to the adherend becomes also impaired.

In the present invention, examples of the curing agent are amine curing agents, acid anhydride curing agents, phenolic resin curing agents, and catalyst curing agents. They are not specifically limited so long as they undergo curing reactions with the epoxy resin.

Examples of the amine curing agents are diethylenetriamine, triethylenetetramine, bis(hexamethylene)-triamine, trimethylhexamethylenediamine, menthenediamine, isophoronediamine, m-xylylenediamine, 3,9-bis(3-aminopropyl)-2,4,8-tetraspiro[5.5]undecane, m-phenylenediamine, diaminodiphenylmethane, diaminodiphenylsulfone, 4,4'-methylenebis(2-chloroaniline), and adducts thereof with the epoxy resin. Examples of the acid anhydride curing agents include phthalic anhydride, trimellitic anhydride, pyromellitic anhydride, benzophenonetetracarboxylic anhydride, maleic anhydride, tetrahydrophthalic anhydride, hexahydrophthalic anhydride, methyl nadic anhydride, methylcyclohexenetetracarboxylic anhydride, tetrachlorophthalic anhydride, and tetrabromophthalic anhydride. Examples of the phenol curing agents are phenol, o-cresol novolak, phenol novolak, and phenol aralkyl. The catalyst curing agents include tertiary amines such as benzyldimethylamine, 2,4,6-tris(dimethylaminomethyl)phenol, piperidine, pyridine, and picoline; and imidazoles such as 2-ethyl-4-methylimidazole. Additional examples include 1,8-diazabicyclo[5.4.0]undecene, Lewis acid (such as $BF_3$), dicyanediamide, amineimide, organic acid hydrazide, and mixtures, salts, and complexes, thereof. The amount of the catalyst curing agent should be 0.1 to 20 phr for the epoxy resin, and the amount of the other curing agents should be 0.5 to 2 equivalents for the epoxy group.

According to the present invention, additives are as required are used such as fillers, flame retardants, reinforcing materials, lubricants, dispersing agents, surface active agents, pigments, dyes, and coupling agents. Examples of the fillers are organic fillers such as aramid fiber and nylon fiber other than inorganic fillers. Examples of the flame retardants are antimony trioxide, aluminum hydroxide, red phosphorus, and halogen compounds. Examples of the lubricants, dispersing agents, and surface active agents are wax, zinc stearate, and silicone oil. Examples of the pigments and dyes are carbon black, red oxide, titanium white, and cyanine blue. Examples of the coupling agents are silane coupling agents and titanium coupling agents.

According to the present invention, the contemplated thermosetting adhesive sheet is prepared by forming a layer of the epoxy resin composition in a substantially uncured state to one surface of a plastics film having a thickness of 10 to 1000μ, preferably 20 to 200μ. When the thickness is 10 to 1000μ, the epoxy resin becomes collected in the vicinity of the film under the action of surface tension when melted by heating and is thereafter cured and adhered by continued heating. Examples of useful plastics films are polyimide film, polyamideimide film, polyamide film, polyester film, polycarbonate film, polyphenylene sulfide film, polysulfone film, poly-p-phenyleneterephthalamide film, polyethersulfone film, polyphenylenesulfone film, polyarylate film, polyetheretherketone film, phenolic resin film and the like.

Preferably, the film is one which is flame retardant and diminished in warping property and exhibits strong adhesion to the epoxy resin composition to be used in the invention. These films have high heat resistance.

The film can be given greatly improved adhesion to the epoxy resin composition when surface-treated as by corona discharge or with a chemical. The term the "substantially uncured state" refers to a state in which the composition can still be melted by heating although the composition might have been cured to some extent.

The layer of epoxy resin composition can be formed, for example, by making the composition into a sheet and fusing the sheet to the surface of the plastics film, or by coating the surface of the plastics film with the composition.

According to the present invention, the epoxy resin sheet obtained is blanked in a shape in conformity with the configuration of the portion of the electronic part to be sealed. This means that when the portion to be sealed is circular and has a radius of 1 cm and a thickness of 0.5 mm as shown in FIG. 1, a circular piece up to 1 cm in radius is blanked out from a film-coated sheet of epoxy resin composition having a thickness of 0.5 mm. Preferably, the blank is not smaller than 0.9 cm to not larger than 1 cm in radius. In the case where a portion having projecting terminals 1 as shown in FIG. 2 is to be sealed, a piece permitting insertion of the terminals therethrough is blanked out from the film-coated epoxy resin composition sheet as shown in FIG. 3.

When the sealing material coated with a thermosetting film of the invention is used, the flowability of the material in a molten state is controllable.

For example, FIGS. 4 (a) and (b) show coils of FIG. 2 having projecting terminals 1 and sealed with (a) the film-coated sealing material of the invention or (b) a sealing material not coated with any film, by placing the material on the surface to be sealed and curing the material. In the case of the material (a), the epoxy resin 3 does not creep up along the terminal 1 because the flow of the resin is prevented by the film 2, whereas in the case of the uncoated material (b), the resin rises markedly along the terminal to result in faulty electrical conduction. Indicated at 4 is the body of the electronic part.

Further in the case where relays are sealed with (a) a film-coated blank or (b) an uncoated blank which is shaped in conformity with the configuration of the surface to be sealed, by placing the blank on the surface and curing the blank, the material (a) in a molten state does not collect to the central portion by being controlled by the film but flows to the peripheral portion to exhibit improved flowability, whereas in the case of the uncoated blank (b), the epoxy resin in a molten state collects to the central portion, failing to flow smoothly and to seal the peripheral portion of the relay case properly.

The use of the film-coated shaped material made of an epoxy resin composition results in the following advantages:

(1) The film laminated to the composition controls the flowability of the composition in the molten state, obviating faults in sealing and diminishing the creeping of the composition along the lead pin.

(2) The film laminated to the composition gives excellent smoothness and gloss to the surface of the cured seal.

(3) The sheet of the film-coated epoxy resin composition has mechanical strength permitting blanking in a complex and delicate configuration and further permitting use of a parts feeder, robot or like automating devices. This entails great advantages in making the process automatic and less costly. The sheet is resistant to handling for transport or vibration, therefore it remains free of damage and will not stain the electronic part.

The frame of the invention for preventing the flow of the chip sealing material is obtained by shaping the film-coated epoxy resin into the form of a frame. The epoxy resin can be shaped into the frame by forming a sheet by a press, extruder or the like and blanking the sheet, or by injection molding.

The flow preventing frame of the present invention can be in any desired shape, such as a circular, square, rectangular, rhombic, elliptical or other shape. FIG. 5 show the flow preventing frame of the invention in section. Indicated at 5 is a film, and at 6 a frame of epoxy resin in a substantially uncured state before melting. The film is placed on the frame. FIG. 6 shows the flow preventing frame in section having the film 5 and the frame 6 of epoxy resin in an uncured molten state. FIGS. 5 and 6 appear the same with little or no difference therebetween. FIG. 7 shows the preventing frame of the invention as used for preventing the sealing material from flowing. The sealing material 9 sealing a bare IC chip 8 on a substrate 7 is prevented from flowing by the frame 10.

In the case where the shaped material of the invention comprising the film-coated epoxy resin sheet is cured in two divided steps, the material exhibits higher shape retentivity, and the flow preventing frame exhibits improved ability to retain the width of frame lines.

In the first step of this curing process, the blanked-out shaped material is gelled at a temperature at which the material adheres to the adherend on melting but will not flow out. In the second step, the epoxy resin composition is completely cured without flowing out at a higher temperature than in the first step. Since the blanked-out shaped material contains a curing agent, the material starts curing when heated. While the curing temperature and the curing time are parameters of the quantity of heat, a low curing temperature, for example, requires a longer curing time to obtain sufficiently cured characteristics, whereas a high curing temperature needs a short curing time (although there is a lower limit to low curing temperatures since the epoxy resin composition must be melted).

First in the curing step, the blanked-out material is maintained approximately at a temperature at which it starts melting and caused to microscopically locally fuse to the adherend. At this time, the melt viscosity is so that resin will not flow out macroscopically. The material is held in this state until it gels.

Next in the second curing step, the material is completely cured at a high temperature within a short period of time. In this step, the material which has gelled in the first step substantially retains its shape without flowing out. The temperature in the first step at which the material adheres to the adherend on melting without flowing out is determined according to the kinds and amounts of epoxy resin, thermoplastic resin, inorganic filler and curing agent and is usually in the range of 50° to 120° C. The curing temperature of the second step is usually in the range of 100° to 180° C. and is higher than in the first step.

The frame of the present invention for preventing the flow of the sealing material has the following advantages.

(1) It is shaped in the form of a frame before use and is therefore very easy to handle.

(2) When the frame is adhered on melting by heating, the film controls the flowability of the epoxy resin composition so that the frame will not collapse.

(3) When cured, the epoxy resin can be made into a frame form which has excellent properties of the resin, i.e., excellent heat resistance, insulating property, solvent resistance and adhesion.

(4) To prevent the flow of the sealing material, the frame permits use of an automatic labor-saving method for forming a bank of stabilized shape as positioned accurately, whereby a seal can be formed with an improved quality.

(5) The flow preventing frame retains the specified frame forming line width, which prevents flow of the sealing material to unnecessary portions. This makes it possible to fabricate integrated circuits of increased complexity.

(6) In preventing corrosion of coils, the frame prevents flow of the adhesive to portions other than the portion to be sealed.

The present invention will be described with reference to the following examples and comparative examples.

FIGS. 5 and 6 are sectional views showing a frame of the invention for preventing the flow of a sealing material, and FIG. 7 is a view showing the frame of the invention as used for preventing the flow of the sealing material.

EXAMPLE 1 to 10

Figure 1:
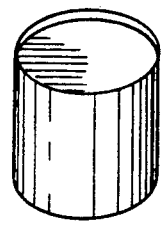
FIGS. 1 and 2 show electronic parts to be sealed.
Figure 2:
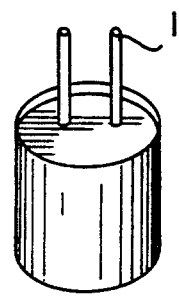
Figure 3:
FIG. 3 shows an example of film-coated shaped material for sealing electronic parts according to the invention.
Figure 4A:
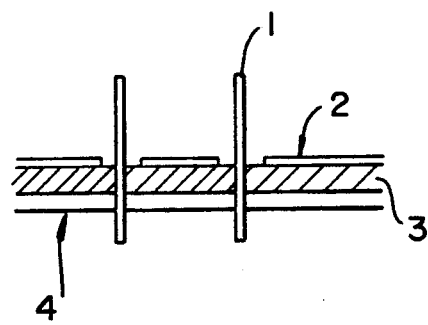
FIG. 4 (a) is a view in section showing a sealing material of the invention as placed on the surface to be sealed and cured, and FIG. 4 (b) is a view in section of a sealing material having no film, as cured.
Figure 4B:
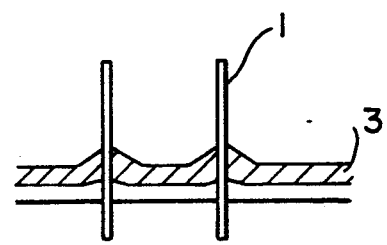

The ingredients listed in Table 1 were melted and mixed together by a kneader at 100° C. for 1 minute. The film listed in Table 1 and 50µ in thickness was placed on the lower plate of a press set to a pressing temerature of 70° C., the molten mixture was placed on the film, and release paper was further placed on the mixture. The mixture was then pressed to obtain a sheet having a thickness of about 0.7 mm using a spacer.

The film-coated sheet was cooled to room temperature and blanked in a shape in conformity with the configuration of the portion of a coil to be sealed. The blanked-out piece was then placed on the coil portion to be sealed and cured at 120° C. for 1 hour. After curing, the seal was checked for sealing effect, creeping of the sealing material on the terminal, and appearance.

As to the sealing effect, a faulty seal was represented by X and a perfect seal by ◯. As to the creeping of the material, creeping over a distance of at least 0.5 mm from the contour of the case is represented by X, and creeping over a smaller distance by ◯. To evaluate the appearance, the surface smoothness and gloss and warping of the film were observed with the unaided eye. When having no problem, the appearance was represented by ◯. If the film was markedly warped, the appearance was represented by X.

TABLE 1

| | Example | | | | | | | | | |
|---|---|---|---|---|---|---|---|---|---|---|
| | 1 | 2 | 3 | 4 | 5 | 6 | 7 | 8 | 9 | 10 |
| Epoxy resin | 100 | 100 | 100 | 100 | 100 | 100 | 100 | 100 | 100 | 100 |
| Thermoplastic resin (1) | 20 | | 40 | | 20 | | 20 | | 20 | |
| Thermoplastic resin (2) | | 20 | | 40 | | 20 | | 20 | | 20 |
| Inorganic filler | 30 | 100 | 30 | 100 | 50 | 50 | 50 | 50 | 100 | 150 |
| Curing agent (1) (equivalent) | 1 | 1 | | | | | | | | |
| Curing agent (2) (parts) | | | 2 | 2 | 2 | 2 | 2 | 2 | 2 | 2 |
| Film | PS | PS | PS | PS | PI | PET | PPS | PAR | PAR | PAR |
| Sealing effect | ◯ | ◯ | ◯ | ◯ | ◯ | ◯ | ◯ | ◯ | ◯ | ◯ |
| Creeping on terminal | ◯ | ◯ | ◯ | ◯ | ◯ | ◯ | ◯ | ◯ | ◯ | ◯ |
| Appearance | ◯ | ◯ | ◯ | ◯ | ◯ | ◯ | ◯ | ◯ | ◯ | ◯ |

Epoxy resin: Bisphenol A type epoxy resin, epoxy equivalent 614
Thermoplastic resin (1): polyester resin, 10,000 in Mn.
Thermoplastic resin (2): polyamide resin, 50,000 in Mn.
Inorganic filler: molten silica.
Curing agent (1): amine curing agent.
Curing agent (2): imidazole curing agent.
Films (thickness 50µ)
PS: polysulfone film.
PI: polyimide film.
PAR: polyarylate film.
PPS: polyphenylene sulfide film.
PC: polycarbonate film.

COMPARATIVE EXAMPLES 1 TO 8

Shaped materials of epoxy resin having or not having a film affixed thereto were each prepared in the same manner as in the foregoing examples with the exception of using the ingredients given in Table 2 in the listed proportions. The same ingredients as in the above examples were used. The materials of Comparative Examples 1 to 4 were tested for solvent resistance, kneadability, blocking property, and strength of the material in the form of an uncured sheet.

Solvent resistance: A cured sample was wiped with cloth wet with MEK and checked for soiling of the surface. When soiled over the surface, the material was represented by X. If otherwise, the material was represented by ◯.

Kneadability: When producing a markedly abrasive effect on the screw, the material was represented by X.

Blocking property: When the blanked-out piece was tacky and stuck to articles at room temperature (23° C.), the material was represented by X. If otherwise, the material was represented by ◯.

Strength of epoxy resin sheet in uncured state: When it was impossible to blank the sheet due to cracking or sticking, the material was represented by X. If it permitting continual blanking operation, the material was represented by ○.

board, and the assembly was thereafter held in an oven heated at 150° C. for 1 hour, whereby the epoxy resin was melted and subsequently cured to form a blank.

A sealing material was further supplied to the bare chip and held in the oven at 150° C. for 1 hour, whereby the material was cured to completely seal the bare chip. At this time, no portion of the sealing material flowed over the frame.

TABLE 2

|  | Com. Ex. |  |  |  |  |  |  |  |
|---|---|---|---|---|---|---|---|---|
|  | 1 | 2 | 3 | 4 | 5 | 6 | 7 | 8 |
| Epoxy resin | 100 | 100 | 100 | 100 | 100 | 100 | 100 | 100 |
| Thermoplastic resin (1) | 2 | 100 | 20 |  | 20 |  | 20 |  |
| Thermoplastic resin (2) |  |  |  | 40 |  | 40 |  | 40 |
| Inorganic filler | 50 | 50 | 3 | 350 | 50 | 50 | 50 | 50 |
| Curing agent (1) (equivalent) | 1 |  | 1 |  | 1 |  | 1 |  |
| Curing agent (2) (parts) |  | 2 |  | 2 |  | 2 |  | 2 |
| Film | PS | PS | PET | PET | PI (7.5μ) | PC (1500μ) | — | — |
| Sealing effect | ○ | ○ | ○ | ○ | ○ | ○ | X | X |
| Creeping on terminal | ○ | ○ | ○ | ○ | ○ | ○ | X | X |
| Appearance | ○ | ○ | X | ○ | X | X | X | X |
| Solvent resistance | ○ | X | ○ | ○ |  |  |  |  |
| Kneadability | ○ | ○ | ○ | ○ | X |  |  |  |
| Blocking property | ○ | X | ○ | ○ | ○ |  |  |  |
| Strength of sheet | X | ○ | ○ | ○ |  |  |  |  |

Example 11

| Bisphenol A type epoxy resin | |
|---|---|
| (Epikote 1004) | 100 parts by weight |
| Imidazole curing agent | 5 parts by weight |
| Polyester resin | 10 parts by weight |
| Silica | 50 parts by weight |
| Carbon black | 1 part by weight |

The above ingredients were melted and mixed together by a kneader at 100° C. for 1 minute, and the molten mixture was placed on a polyimide film 75μ in thickness and placed on the lower plate of a press set to a plate temperature of 70° C. With release paper placed over the mixture, the mixture was pressed to a thickness of about 0.7 mm using a spacer. The composite sheet thus obtained was cooled to room temperature and then blanked in the form of a frame measuring 10 mm in inside diameter and 12 mm in outside diameter.

The frame was placed with the film side up on a substrate carrying a bare IC chip thereon, with the chip positioned approximately at the center of the frame, and was then placed into an oven heated at 150° C. for 1 hour, whereby the epoxy resin was melted and thereafter cured to form a bank.

Further a sealing material was supplied to the bare chip and held in the oven at 150° C. for 1 hour, whereby the sealing material was cured to completely seal the bare chip. At this time, no portion of the sealing material flowed over the frame.

EXAMPLE 12

To one surface of a glass-epoxy printed board having a thickness of 0.5 mm was applied a mixture of 100 parts by weight of bisphenol A type epoxy resin (Epikote 828) and 26 parts by weight of diaminodiphenylmethane which was prepared at 70° C. The mixture, which had a tacky surface as thus applied, was heated at 70° C. for 2 hours, whereby an epoxy resin was obtained which was substantially uncured and solid at room temperature. The composite sheet thus obtained was cooled to room temperature and then blanked in the form of frame measuring 10 mm in inside diameter and 12 mm in outside diameter.

The coated board was then placed with the film side up on a substrate carrying a bare IC chip thereon, with the chip positioned approximately centrally of the

COMPARATIVE EXAMPLE 9

A framelike shaped material of epoxy resin prepared in the same manner as in Example 11 with the exception of no polyimide film was placed into an oven at 150° C., whereby the material melted to deform the frame, which lapped over the bare chip locally.

EXAMPLES 13 TO 16

The ingredients given in Table 3 were melted and mixed together in a kneader at 120° C. for 1 minute, and the molten mixture was pressed into a sheet having a thickness of about 0.7 mm by a press set to 120° C. The sheet was blanked to obtain a square frame measuring 10 mm in the outside length of each side and 8 mm in the inside length of each side. The frame was placed on a ceramic piece and then held in an oven set to 100° C. for 1 hour and thereby subjected to a first curing step, whereupon the frame was checked for adhesion to the ceramic piece and the resulting increase in the width of the frame line. Subsequently, the frame was held in the oven at 150° C. for 1 hour, thereby subjected to a second curing step and thereafter checked for adhesion to the ceramic piece and the resulting increase in the width of the frame line. When a frame was to be obtained with a film laminated thereto, the molten mixture was pressed as placed on the film. Table 3 shows the result.

TABLE 3

|  |  | Example |  |  |  |
|---|---|---|---|---|---|
|  |  | 13 | 14 | 15 | 16 |
| (1) | Epoxy resin | 100 | 100 | 100 | 100 |
| (2) | Thermoplastic resin | 30 | 50 |  |  |
| (3) | Thermoplastic resin |  |  | 30 | 50 |

TABLE 3-continued

|  |  | Example | | | |
|---|---|---|---|---|---|
|  |  | 13 | 14 | 15 | 16 |
| (4) | Inorganic filler | 100 | 50 | 100 | 50 |
| (5) | Curing agent | 2 | 2 | 2 | 2 |
| (6) | Film | PI | PI | PPS | PPS |
| (7) | Increase in width of frame line after first curing step (mm) | 0.03 | 0.03 | 0.04 | 0.04 |
| (8) | Adhesion to ceramic piece | ○ | ○ | ○ | ○ |
| (7') | Increase in width of frame line after second curing step (mm) | 0.03 | 0.03 | 0.04 | 0.04 |
| (8') | Adhesion to ceramic piece | ○ | ○ | ○ | ○ |

Notes to Table 3:
(1) Epoxy resin: Epikote 1004.
(2) Thermoplastic resin: polyester resin, 50000 in Mn.
(3) Thermoplastic resin: polyamide resin, 50000 in Mn.
(4) Inorganic filler: molten silica.
(5) Curing agent: imidazole curing agent.
(6) Films
PI: polyimide film.
PPS: polyphenylene sulfide film.
(7) Increase in width of frame line: Line width (mm) after curing - original line width (mm)
(8) Adhesion to ceramic piece: The frame as adhered to the ceramic piece was represented by ○, and the frame not adhered thereto by ×.

COMPARATIVE EXAMPLES 10 AND 11

Experiments were conducted in the same manner as in Examples 13 to 16 using the ingredients listed in Table 4. Altered curing temperatures were used in the first step in Comparative Examples 10 and 11. In Comparative Example 10, the first-step curing temperature was low, and the epoxy resin composition did not gel, so that the second-step curing temperature was set to 150° C. The composition then flowed out. In Comparative Example 11 in which the first-step curing temperature was high, the epoxy resin composition flowed out during curing in the first step.

TABLE 4

|  |  | Com. Example | |
|---|---|---|---|
|  |  | 10 | 11 |
| (1) | Epoxy resin | 100 | 100 |
| (2) | Thermoplastic resin | 30 | 30 |
| (4) | Inorganic filler | 100 | 100 |
| (5) | Curing agent | 2 | 2 |
| (6) | Film | PI | PI |
| (7) | First-step curing temperature (°C.) | 80 | 120 |
| (8) | Increase in width of frame line (mm) | 0.03 | 0.6 |
| (9) | Adhesion to ceramic piece | X | ○ |
| (10) | Second-step curing temperature (°C.) | 150 | 150 |
| (8') | Increase in width of frame line (mm) | 0.8 | 0.6 |
| (9') | Adhesion to ceramic piece | ○ | ○ |

We claim:

1. A film-coated shaped material for use in sealing an electronic part, having high shape retentivity and prepared by forming a film-coated epoxy resin sheet in a shape in conformity with the configuration of the electronic part, the film-coated epoxy resin sheet comprising a plastic film having a thickness of 10 to 1000μ and a layer of a curable epoxy resin composition in a substantially uncured state and formed on one surface of the film, the epoxy resin composition comprising per 100 parts by weight of an epoxy resin, 5 to 50 parts by weight of a thermoplastic resin having a number average molecular weight of at least 5000, 5 to 300 parts by weight of an inorganic filler and a curing agent.

2. A shaped material as defined in claim 1 wherein the film-coated epoxy resin sheet has a thickness of 0.1 to 2 mm.

3. A chip sealing material flow preventing frame comprising the film-coated epoxy resin sheet of claim 1.

4. A shaped material for use in sealing an electronic part, having high shape retentivity and comprising the film-coated epoxy resin sheet of claim 1, wherein the shaped material is thermally curable by two divided steps, a first step of gelling the shaped material at a temperature at which the material melts and adheres to an adherent without flowing out, and a second step of curing the epoxy resin composition at a higher temperature than in the first step without allowing the composition to flow out.

5. A chip sealing material flow preventing frame comprising the shaped material of claim 4.

* * * * *